(12) United States Patent
Kekare (10) Patent No.: US 9,689,923 B2
(45) Date of Patent: Jun. 27, 2017

(54) ADAPTIVE ELECTRICAL TESTING OF WAFERS

(71) Applicant: KLA-Tencor Corporation, Milpitas, CA (US)

(72) Inventor: Sagar A. Kekare, Milpitas, CA (US)

(73) Assignee: KLA-Tencor Corp., Milpitas, CA (US)

(*) Notice: Subject to any disclaimer, the term of this patent is extended or adjusted under 35 U.S.C. 154(b) by 30 days.

(21) Appl. No.: 14/450,027

(22) Filed: Aug. 1, 2014

(65) Prior Publication Data

US 2015/0039954 A1 Feb. 5, 2015

Related U.S. Application Data (60) Provisional application No. 61/861,973, filed on Aug. 3, 2013.

(51) Int. Cl.
*G06F 17/50* (2006.01)
*G01R 31/3185* (2006.01)
*H01L 21/66* (2006.01)

(52) U.S. Cl.
CPC ...... *G01R 31/318511* (2013.01); *H01L 22/14* (2013.01); *H01L 22/20* (2013.01)

(58) Field of Classification Search
CPC .................................................. G06F 17/5081
USPC ........................................................ 716/136
See application file for complete search history.

(56) References Cited

U.S. PATENT DOCUMENTS

| | | | |
|---|---|---|---|
| 6,154,714 A | 11/2000 | Lepejian | |
| 6,526,545 B1 | 2/2003 | Lin et al. | |
| 6,618,682 B2 | 9/2003 | Bulaga et al. | |
| 7,073,107 B2 | 7/2006 | Madge et al. | |
| 7,570,796 B2 | 8/2009 | Zafar et al. | |
| 7,676,077 B2 | 3/2010 | Kulkarni et al. | |
| 8,000,519 B1 | 8/2011 | Zheng et al. | |
| 8,190,953 B2 | 5/2012 | Chakravarthy et al. | |
| 8,453,088 B2 | 5/2013 | Akar et al. | |
| 2002/0173942 A1 | 11/2002 | Rajsuman et al. | |

(Continued)

FOREIGN PATENT DOCUMENTS

| | | |
|---|---|---|
| JP | 2006-138705 | 6/2006 |
| KR | 10-2001-0037026 | 5/2001 |

OTHER PUBLICATIONS

International Search Report and Written Opinion for PCT/US2014/049515 mailed Nov. 26, 2014.

*Primary Examiner* — Suchin Parihar
(74) *Attorney, Agent, or Firm* — Ann Marie Mewherter (57) ABSTRACT

A method and a system for determining one or more parameters for electrical testing of a wafer are provided. One method includes determining electrical test paths through a device being formed on a wafer and physical layout components in different layers of the device corresponding to each of the electrical test paths. The method also includes determining one or more parameters of electrical testing for the wafer based on one or more characteristics of the electrical test paths. In addition, the method includes acquiring information for one or more characteristics of a physical version of the wafer. The information is generated by performing an inline process on the physical version of the wafer. The method further includes altering at least one of the one or more parameters of the electrical testing for the wafer based on the acquired information.

36 Claims, 5 Drawing Sheets

(56) References Cited

U.S. PATENT DOCUMENTS

| | | | |
|---|---|---|---|
| 2004/0059456 A1* | 3/2004 | Bode | H01L 22/20 700/121 |
| 2005/0060681 A1* | 3/2005 | Robson et al. | 716/21 |
| 2007/0156379 A1* | 7/2007 | Kulkarni et al. | 703/14 |
| 2007/0288219 A1* | 12/2007 | Zafar | 703/14 |
| 2008/0072207 A1* | 3/2008 | Verma et al. | 716/21 |
| 2008/0167829 A1* | 7/2008 | Park et al. | 702/81 |
| 2008/0206903 A1 | 8/2008 | Chan et al. | |
| 2008/0270953 A1* | 10/2008 | Foreman et al. | 716/4 |
| 2010/0109005 A1* | 5/2010 | Grillberger | H01L 22/34 257/48 |
| 2012/0131527 A1 | 5/2012 | Kekare | |
| 2014/0046466 A1* | 2/2014 | Bickford et al. | 700/97 |
| 2014/0303912 A1* | 10/2014 | Banerjee | H01L 22/20 702/57 |

* cited by examiner

ADAPTIVE ELECTRICAL TESTING OF WAFERS

BACKGROUND OF THE INVENTION

1. Field of the Invention

This invention generally relates to methods and systems for altering at least one parameter of electrical testing for a wafer based on information for one or more characteristics of a physical version of the wafer generated by performing an inline process on the physical version of the wafer.

2. Description of the Related Art

The following description and examples are not admitted to be prior art by virtue of their inclusion in this section.

At some point after fabrication of integrated circuits (ICs) on wafers, the ICs are electrically tested for quality control purposes. The testing may be performed to determine if a chip passes or fails electrical performance requirements. In addition, electrical testing may be performed to determine why a chip is performing the way that it is. Such testing may be used to determine information about the process that was used to fabricate the chip. In addition, such testing may be used to determine information about the chip itself (e.g., if the design of the chip is causing problems for the production).

Adaptive electrical testing practices are in place and being used today. However, they are primarily driven by real time signals from the electrical testing floor regarding the health of various components of the test infrastructure. These current practices generally do not consider inline wafer-related data in deciding the direction and intent of dynamic adaptation. In some particular cases, specific IC vendors may have chosen to consider some of the vast inline wafer-related data to drive adaptation choices. But the detailed granularity of defect parameters against specifications and stability data attributes offered by today's inline inspection, metrology, and tool monitoring systems is not linked to testing in any of the industry's adaptive testing practices.

Older methods of electrical testing are able to look at the inline defect data at a full wafer or an individual die level where this is a mostly manual decision driven by an engineer's judgment. These methods typically trigger a binary switch from a less intensive pass/fail type of test plan with a relatively small number of individual test vectors to a more intensive debug type of test plan with a relatively large number of individual test vectors. In cases of relatively high defect levels or metrology shifts reported by a fab, the test engineers can consider one of the two following approaches.

In the first approach, the electrical testing may involve testing the entire wafer with the pass/fail test plan and then 1) ink-dotting the failed dies for scrapping without any further testing, or 2) sending the ink-dotted dies for failure analysis. Failure analysis engineers look for any correlation between failed dies and the reported inline defect locations or (much less frequently) metrology values to guide root cause determination. If the inline data is not helpful, then the failure analysis engineer may also invoke a second test within a debug test plan. As the name indicates, the debug test plan is aiming for electrically localizing the failure within the device circuitry. However, in some cases, the debug test plan may indicate the die to be conditionally good and suitable for only a limited set of functions. Such dies could then be labeled as "good" for sale into a different, less stringent market, e.g., speed binning of processor chips.

In the second approach, during yield ramp, it is quite common to skip the pass/fail test plan on a few sampled wafers and send them directly through the debug test plan in offline mode. These wafers are typically also singled out for defect inspections and metrology at critical patterning layers during wafer fabrication.

In either approach, the contents of both the test plans have been fixed ahead of time. The pass/fail test plan operates on a "stop on first fail" prescription, which saves some test time per die by avoiding continued application of subsequent tests from the complete plan, once a die has failed a certain test. However, this test time reduction comes at the cost of any ability to localize the failures within the device circuitry. Thus, there is minimal guidance from such testing for any failure analysis purpose.

The debug test plan is designed to test the circuitry with a finer resolution and coverage such that when the test data is collected it allows triangulation of a likely failure location through comparison of observed and ideal test responses. There is a diminishing return with increasing number of tests and typically the actual number of tests is decided based on a balance of resolution and test time.

Both of the approaches described above are time consuming and require a production wafer to be pulled offline for additional testing. This is not an overhead that test engineers willingly accept. Any methodology that takes away some or all of this test time overhead should be very appealing to test engineers.

Accordingly, it would be advantageous to develop methods and systems for determining one or more parameters for electrical testing of a wafer that do not have one or more of the disadvantages described above.

SUMMARY OF THE INVENTION

The following description of various embodiments is not to be construed in any way as limiting the subject matter of the appended claims.

One embodiment relates to a computer-implemented method for determining one or more parameters for electrical testing of a wafer. The method includes determining electrical test paths through a device being formed on a wafer and physical layout components in different layers of the device corresponding to each of the electrical test paths. The method also includes determining one or more parameters of electrical testing for the wafer based on one or more characteristics of the electrical test paths. In addition, the method includes acquiring information for one or more characteristics of a physical version of the wafer. The information is generated by performing an inline process on the physical version of the wafer. The method further includes altering at least one of the one or more parameters of the electrical testing for the wafer based on the acquired information. Determining the electrical test paths, determining the one or more parameters, acquiring the information, and altering the at least one parameter are performed by one or more computer systems.

Each of the steps of the method described above may be performed as described further herein. The method described above may include any other step(s) of any other method(s) described herein. The method described above may be performed using any of the systems described herein.

Another embodiment relates to a non-transitory computer-readable medium storing program instructions executable on a computer system for performing a computer-implemented method for determining one or more parameters for electrical testing of a wafer. The computer-implemented method includes the steps of the computer-implemented method described above, which may be performed as described further herein. In addition, the computer-implemented method for which the program instructions are executable may include any other step(s) of any other method(s) described herein. The non-transitory computer-readable medium may be further configured as described herein.

An additional embodiment relates to a system configured to determine one or more parameters for electrical testing of a wafer. The system includes a process control subsystem configured to acquire information for one or more characteristics of a physical version of a wafer. The information is generated by performing an inline process on the physical version of the wafer. The system also includes a computer subsystem configured for determining the electrical test paths, determining the one or more parameters, and altering the at least one parameter as described above. The system may be further configured as described herein.

BRIEF DESCRIPTION OF THE DRAWINGS

Other objects and advantages of the invention will become apparent upon reading the following detailed description and upon reference to the accompanying drawings in which.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

One embodiment relates to a computer-implemented method for determining one or more parameters for electrical testing of a wafer. In general, the embodiments described herein may be referred to as Adaptive Rearrangement of Tests using Inline Symptoms of Trouble (ARTIST) systems. The methods and system embodiments described herein can be used for reducing integrated circuit (IC) test costs through the use of inline defect, metrology, and monitoring data. As will be described further herein, the embodiments can be used to adaptively rearrange electrical testing of IC products using defect/metrology data distribution and attributes as captured by the latest inline wafer inspection, metrology, and tool/materials monitoring systems towards overall reduction in test costs. The embodiments allow IC vendors to dynamically rearrange their test choices to pick out defective dies more quickly at lower test costs per chip.

Figure 6:
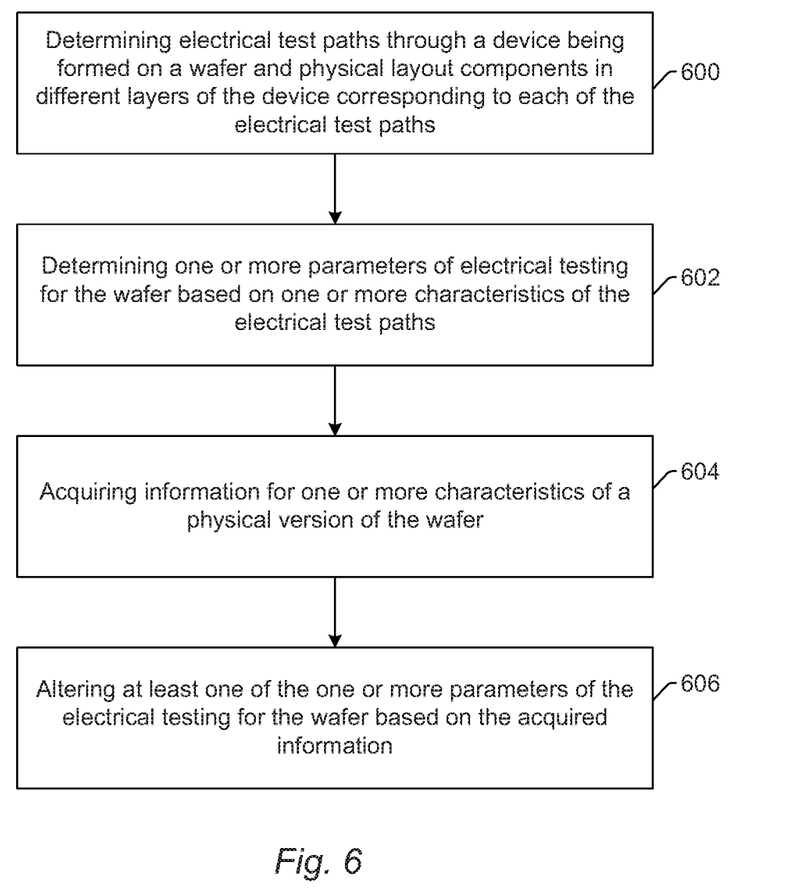
FIG. 6 is a flow chart illustrating one embodiment of a computer-implemented method for determining one or more parameters for electrical testing of a wafer.

The method includes determining electrical test paths through a device being formed on a wafer and physical layout components in different layers of the device corresponding to each of the electrical test paths, as shown in step 600 of FIG. 6. In one embodiment, determining the electrical test paths through the device being formed on the wafer and the physical layout components in the different layers of the device corresponding to each of the electrical test paths is performed by processing design data for the device being formed on the wafer. For example, determining the electrical test paths may include analyzing an IC design to break down electrical test paths through the circuit into their physical layout components along each mask layer. In another example, determining the electrical test paths may include design analysis to aggregate test vectors and test vector sequences that stress specific mask layer(s) and/or design sub-section(s).

The terms "design" and "design data" as used herein generally refer to the physical design (layout) of an IC and data derived from the physical design through complex simulation or simple geometric and Boolean operations. In addition, an image of a reticle acquired by a reticle inspection system and/or derivatives thereof can be used as a "proxy" or "proxies" for the design. Such a reticle image or a derivative thereof can serve as a substitute for the design layout in any embodiments described herein that use a design. The design may include any other design data or design data proxies described in commonly owned U.S. Pat. No. 7,570,796 issued on Aug. 4, 2009 to Zafar et al. and U.S. Pat. No. 7,676,077 issued on Mar. 9, 2010 to Kulkarni et al., both of which are incorporated by reference as if fully set forth herein. In addition, the design data can be standard cell library data, integrated layout data, design data for one or more layers, derivatives of the design data, and full or partial chip design data.

In general, however, the design information or data cannot be generated by imaging a wafer with a wafer inspection system. For example, the design patterns formed on the wafer may not accurately represent the design for the wafer and the wafer inspection system may not be capable of generating images of the design patterns formed on the wafer with sufficient resolution such that the images could be used to determine information about the design for the wafer. Therefore, in general, the design information or design data cannot be generated using a physical wafer. In addition, the "design" and "design data" described herein refers to information and data that is generated by a semiconductor device designer in a design process and is therefore available for use in the embodiments described herein well in advance of printing of the design on any physical wafers.

The method also includes determining one or more parameters of electrical testing for the wafer based on one or more characteristics of the electrical test paths, as shown in step 602 of FIG. 6. These one or more parameters of the electrical testing will be altered based on inline data acquired for a physical version of the wafer as described further herein. However, before the inline information has been acquired, general parameters for the electrical testing can be set based on information about the electrical test paths as well as any other information for the wafer. For example, based on information about the devices being formed on the wafer as well as the electrical test paths, a basic electrical testing plan can be generated for the wafer. These one or more parameters may include any one or more parameters that are normally included in an electrical testing plan or recipe. The electrical testing described herein may be any electrical testing that is performed on any devices fabricated on wafers by any type of electrical testing equipment. In other words, the embodiments described herein are not limited to any type of electrical testing.

In one embodiment, the one or more characteristics of the electrical test paths include a pareto of the electrical test paths as a function of fractions of layout lengths for the electrical test paths on one of the different layers. For example, determining the one or more characteristics may include creating a pareto of test paths based on the fraction of their layout length represented on a given mask layer X. In another embodiment, the one or more characteristics of the electrical test paths include different paretos for each of the different layers of interest, and each of the different paretos are of the electrical test paths as a function of fractions of layout lengths for the electrical test paths on its corresponding one of the different layers. For example, determining the one or more characteristics may include creating a series of the paretos described above, one per layout layer of interest.

In some embodiments, the one or more parameters of the electrical testing include test vector sequences that stress one of the different layers in a preferential manner. For example, determining the one or more parameters of the electrical testing may include organization of test vector sequences that stress a given layer X in a preferential manner using the data generated in the steps described above. In another embodiment, the one or more parameters of the electrical testing include different test vector sequences for each of the different layers that are of interest to a user, and the different test vector sequences are for stressing each of the different layers in a preferential manner. For example, the test vector sequences may be created for each layer of interest. In an additional embodiment, the one or more parameters of the electrical testing include different test vector sequences for each of the different layers that are of interest to a user, and the different test vector sequences are for stressing each of the different layers in a preferential manner and based on design sub-sections within the different layers. For example, the test vector sequences may be created for each layer of interest and by any key design sub-sections for each layer of interest.

In some embodiments, the method includes storing the one or more parameters of the electrical testing in a storage medium. The one or more parameters include test vector sequences in different test plans for the wafer, and each of the different test plans is stored with identification for the different layers or different design sub-sections within the different layers that the different test plans stress preferentially. For example, the method may include aggregation of the test vector sequences described herein into different test plans and each of the test plans may be identified in a manner that highlights the mask layer and/or design subsection which they stress preferentially. This information may be stored in any suitable data structure such as a lookup table in any suitable storage medium including those described further herein. In this manner, the method may include creation of a lookup table of test vectors and test vector sequences by the mask layers and/or design sub-sections.

The method also includes acquiring information for one or more characteristics of a physical version of the wafer, as shown in step 604 of FIG. 6. The information is generated by performing an inline process on the physical version of the wafer. The physical version of the wafer may be the physical wafer at any stage or step in the fabrication process. For example, the physical version of the wafer may be the physical wafer after a deposition, lithography, etch, polishing or other fabrication process is performed on the wafer. In another embodiment, the inline process is performed during a process step or between process steps of fabrication of the device on the wafer. In other words, the inline process may be performed on the wafer at a time between the beginning of the first fabrication step performed on the wafer and after the last fabrication step has been performed on the wafer. For example, the inline process may be a defect detection process that is performed on the wafer after a lithography or etch step. In another example, the inline process may be a metrology process that is performed on the physical wafer during an etch step. The inline process may essentially be any process that generates information about a physical wafer at some point in the fabrication process involving the wafer that can be performed by a process control system or tool.

In one embodiment, the information for the one or more characteristics of the physical version of the wafer includes information for defects detected on the physical version of the wafer by a wafer inspection system or a wafer defect review system. The information for the defects may include any suitable information such as locations of the defects, defect IDs, one or more characteristics of the defects such as size, shape, orientation, and the like. The wafer inspection system and wafer defect review system may include any such commercially available tools. Such systems may also be configured as described further herein. In another embodiment, the information for the one or more characteristics of the physical version of the wafer includes measurements of the one or more characteristics performed on the physical version of the wafer by a wafer metrology system. The measurements of the one or more characteristics performed by the wafer metrology system may include any such measurements including, but not limited to, critical dimension of one or more structures formed on the wafer, overlay or alignment of one layer on the wafer to another layer on the wafer, shape characteristics, material characteristics and the like. The wafer metrology system may include any such commercially available tools and may be further configured as described herein.

The information for the characteristic(s) of the physical version of the wafer may also include information generated by one or more tools that perform one or more fabrication steps on the wafer. For example, information about the process that was performed on the wafer (e.g., actual process control information such as temperature, time, material-related information, etc.) may be used to estimate characteristics of the wafer. In addition, information about where a process was operating during a step performed on the wafer with respect to established process control limits may be used to make qualitative judgments about the wafer. For instance, if a process used to deposit a material layer on the wafer is known to have been operating relatively close to the process control limits, then that information may be used by the embodiments described herein to determine that the layer of the device that includes that material layer may be problematic for the device. In this manner, the information that is used by the embodiments described herein may include any information about the physical wafer generated at any point and by any tool during fabrication of the devices on the wafer.

In some embodiments, the information for the one or more characteristics of the physical version of the wafer includes information for which of the different layers on which the inline process was performed. For example, the method may include recording the inline defect, metrology, and layer specific monitoring data captured during wafer manufacturing, labeling it with the layer of observation where applicable, and storage of this data for later use by test engineers. The layer information may be stored with its associated characteristic information in any suitable manner.

In a further embodiment, the information for the one or more characteristics of the physical version of the wafer includes information for locations within any one of the different layers at which the one or more characteristics of the physical version of the wafer were determined by the inline process. For example, the method may include recording the inline defect, metrology, and layer specific monitoring data captured during wafer manufacturing, labeling it with the layer of observation and location of observation within the IC layout where applicable, and storage of this data for later use by test engineers. In one such example, the inline information may include information about defects detected on the wafer along with the layer on which the defects were detected and the locations within the layer at which the defects were detected. In another such example, the inline information may include measurements of the characteristic(s) of the wafer as well as the layer and the locations on the layer at which the measurements were performed. This information may also be stored in any suitable manner.

In an additional embodiment, the information is generated by performing at least one additional inline process on the wafer. For example, the embodiments described herein may use inline information for the wafer that is generated by multiple tools and in multiple inline processes performed on the wafer. In one such embodiment, the inline information that is used as described further herein may include results of multiple wafer inspections performed on the same physical wafer after different processes were performed on that wafer. Other types of information described herein may also be used together in any combination.

The computer-implemented method may include acquiring the information using the tool that performed the inline process. For example, acquiring the information may include scanning light over the wafer with an inspection system, generating output responsive to light from the wafer detected by the inspection system during the scanning, and detecting defects on the wafer using the generated output. In this manner, acquiring the information may be performed using the physical wafer. However, acquiring the information does not necessarily include performing the inline process on the wafer. For example, acquiring the information may include acquiring the information from a storage medium in which the information has been stored (e.g., by an inspection system, a defect review system, a metrology system, etc.). Acquiring the information from the storage medium may be performed in any suitable manner, and the storage medium from which the information is acquired may include any of the storage media described herein.

The method further includes altering at least one of the one or more parameters of the electrical testing for the wafer based on the acquired information, as shown in step 606 of FIG. 6. The embodiments described herein are therefore different from currently used methods and systems for adaptive electrical testing. For example, previously used methods for adaptive testing do not analyze the design elements exercised by the test vectors at all. Hence, the previously used methods could not make any real time decisions about the order of application of test vectors based on online data related to a given batch of wafers. In contrast, the embodiments described herein identify physical attributes of test paths and tie them to the physical attributes of inline data for the purpose of making real time decisions about the electrical testing.

Altering the at least one of the one or more parameters of the electrical testing based on the acquired information obviously will involve determining some spatial correlation between data in the acquired information and the electrical test paths through the device. For example, such a spatial correlation would be used to determine which of the electrical test paths, and their corresponding physical layout components, would be affected by a defect or other characteristics of the physical version of the wafer. The spatial correlation can be determined in a few different spatial coordinate systems. For example, the test vector path locations may be determined in terms of mask or wafer level coordinate systems as opposed to the IC layout coordinate system. In some such instances, the test paths may be anchored to specific care area IDs during inspection or to metrology site coordinates on the reticle/wafer level coordinate systems. Obviously, the embodiments described herein can be used with all forms of physical coordinate systems.

In one embodiment, altering the at least one parameter includes selecting an order in which different tests are performed during the electrical testing. For example, altering the at least one parameter may include real time correlation of the inline defects to test vector sequences for targeting specific mask layers for priority during testing.

Figure 1:
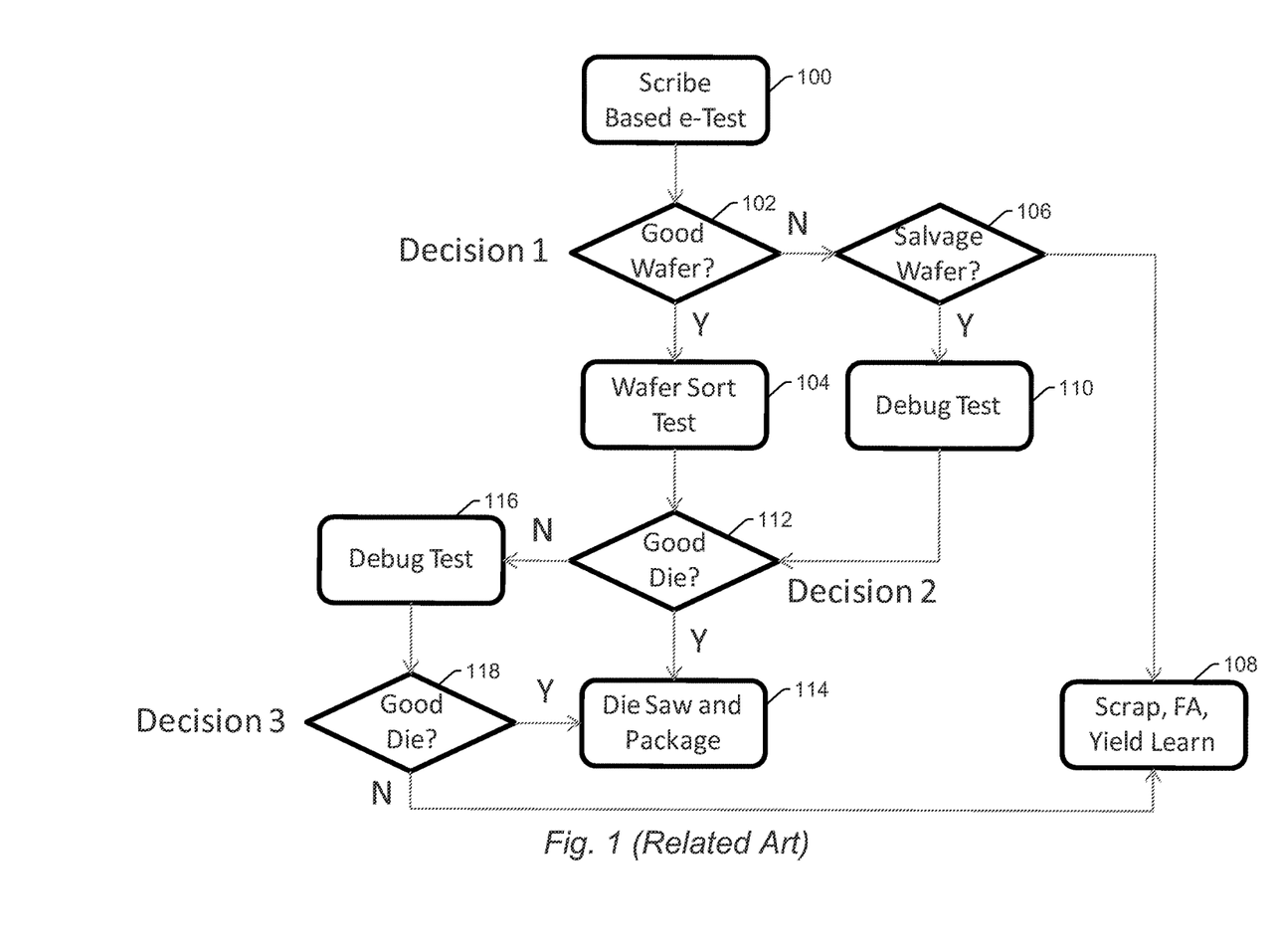
FIG. 1 is a flow chart illustrating one example of a currently used electrical testing flow and related decision making.
Figure 2:
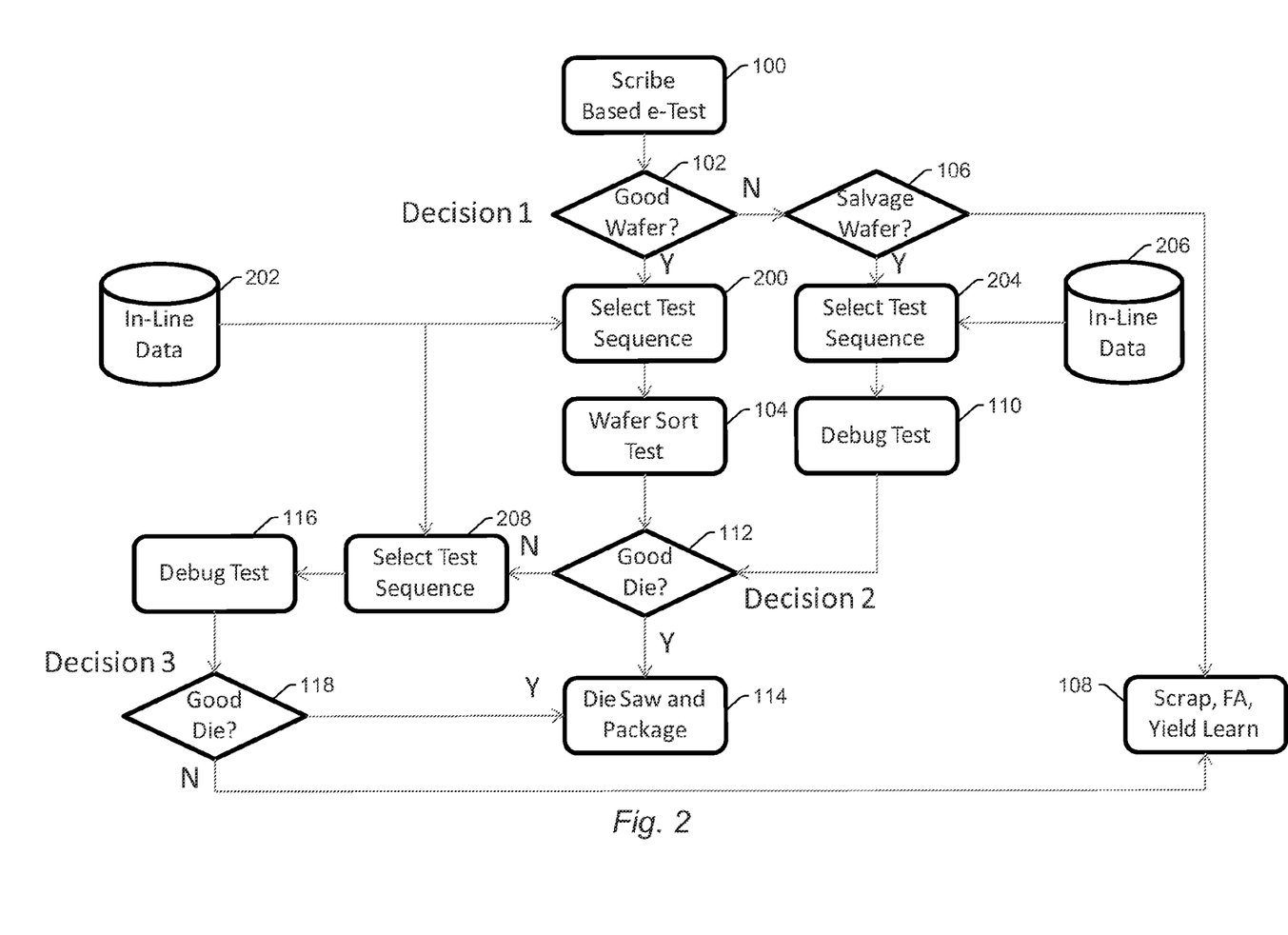
FIG. 2 is a flow chart illustrating one embodiment of an electrical testing flow and related decision making.

FIGS. 1 and 2 illustrate the ways in which previously used electrical testing methods are different from the embodiments described herein. For example, in the currently used method shown in FIG. 1, the electrical test flows and related decisions that are performed today generally include full die level decisions. In this currently used flow example, the electrical testing may include step 100 in which a scribe based electrical test (or e-Test) is performed. The scribe based electrical test may be any suitable such test known in the art.

Based on the results of the scribe based electrical test, decision 1 shown in step 102 may include determining if the wafer is a good wafer. If the wafer is determined to be a good wafer, the method may proceed to wafer sort test shown in step 104. The wafer sort test may include any suitable such test known in the art. If the wafer is determined to not be a good wafer, the method may proceed to step 106 in which it is determined if the wafer can be salvaged.

If the wafer cannot be salvaged, then step 108 may be performed in which the wafer is scrapped, failure analysis (FA) is performed on the wafer, and/or yield learning testing is performed. If it is determined that the wafer can be salvaged, then the method may include step 110 in which a debug test is performed, which may include any suitable such test known in the art.

The results of the wafer sort test and the debug test can be used in decision 2 shown in step 112 in which it is determined if individual dies on the wafer are good dies. If a die is determined to be a good die in step 112, the method includes die saw and package step 114 for the good die, which may be performed in any suitable manner. If a die is not determined to be a good die, then the method may proceed to step 116 in which a debug test is performed for the die that is not good, which may include any suitable debug test known in the art.

The results of the debug test performed in step 116 may be used for decision 3 shown in step 118 in which it is determined if the die on which this debug test was performed is a good die. If the die is determined to be a good die, then the method may proceed to die saw and package step 114 for the die under test. If the die is not determined to be a good die, then the method may proceed to step 108 in which the die is scrapped, FA is performed on the die, and/or yield learning testing is performed on the die.

In contrast to the currently used method shown in FIG. 1, FIG. 2 illustrates one embodiment of test flows and decisions that may be included in the method embodiments described herein. Steps of this method that may be performed as described with respect to FIG. 1 are indicated with the same reference numerals. As will be evident from the following description of FIG. 2, the new method includes a number of different steps that may be performed at the design block and layout levels. For example, as shown in step 200, in the new method, when a wafer is determined to be a good wafer in step 102, the method may include selecting a test sequence for the wafer based on inline data 202, which may include any of the acquired information described herein that is generated by performing an inline process on the physical version of the wafer. Selecting the test sequence for the wafer in step 200 may be performed at the layer level, the design block level or the physical layout component level as described further herein. Wafer sort testing shown in step 104 may then be performed according to the test sequence determined in step 200.

As further shown in FIG. 2, if in step 106, it is determined that the wafer can be salvaged, then the method may include step 204 in which a test sequence is selected for the debug testing shown in step 110. Selecting the test sequence in step 204 may be performed using inline data 206. Inline data 202 used for selecting the test sequence in step 200 may be the same or different than inline data 206 that is used in step 204. In addition, inline data 202 and inline data 206 may include all of the inline data that is generated for any one wafer in multiple inline processes (e.g., different wafer inspections performed at different points in fabrication, one or more wafer inspections and one or more metrology processes performed at the same or different points in fabrication, etc.), and the same or different portions of all of the inline data can be used for steps 200 and 204 (e.g., only a portion of all of the inline data is used for both steps, only a first portion of all of the inline data is used for one of the steps and only a second portion, different from the first, is used for the other of the steps, or the entirety of all of the inline data is used for both steps). Selecting the test sequence in step 204 may further be performed as described herein. Selecting the test sequence for the wafer in step 204 may be performed at the layer level, the design block level or the physical layout component level as described further herein. Debug testing shown in step 110 may then be performed according to the test sequence determined in step 204.

As also shown in FIG. 2, if in step 112, it is determined that a die on the wafer is not good, then the method may include step 208 in which a test sequence is selected for the debug testing shown in step 116. Selecting the test sequence in step 208 may be performed using inline data 202. As with steps 200 and 204, the inline data that is used in step 208 may be the same as or different than the inline data used in steps 200 and 204. Selecting the test sequence in step 208 may be further performed as described herein. Selecting the test sequence for the wafer in step 208 may be performed at the layer level, the design block level or the physical layout component level as described further herein. Debug testing shown in step 116 may then be performed according to the test sequence determined in step 208. The embodiment of the method shown in FIG. 2 may include any other step(s) described herein.

In one embodiment, altering the at least one parameter includes selecting a test vector sequence for the electrical testing that stresses one of the different layers or a portion of one of the different layers in which the information for the one or more characteristics of the physical version of the wafer indicate one or more defects have been detected. For example, the method may include parsing of the lookup table described above for selection of the test vector sequences that stress layers and/or design sub-sections highlighted by the inline defect data (after the wafer has been declared good by a scribe test). The granularity of the test vector sequences may be tailored. For example, test vector sequences that target a given mask layer across the entire design or any subsection of the design may be selected.

Figure 3:
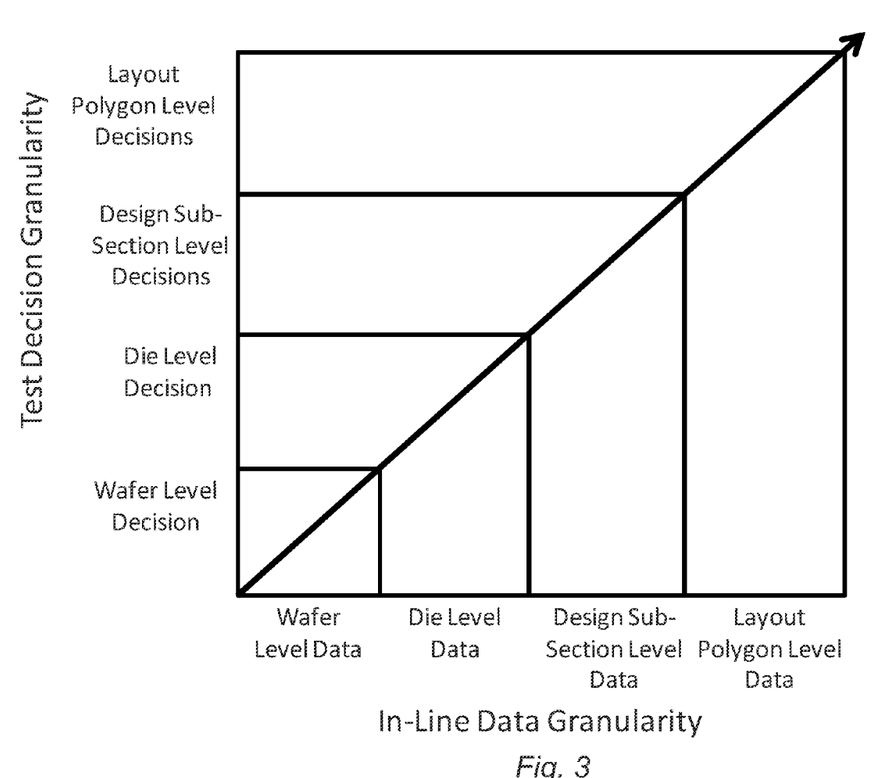
FIG. 3 is a chart illustrating various granularities for electrical testing decisions and inline data provided by the embodiments described herein.

FIG. 3 illustrates the ways in which the inline data can be matched to the decisions that are to be made for electrical testing based on the data. For example, the chart in FIG. 3 illustrates test decision granularity as a function of inline data granularity. The lowest level of granularity in the inline data may be for wafer level data. This data may provide suitable granularity for wafer level decisions. One example of such a wafer level decision is using wafer level inline data such as information about an M1 chemical-mechanical polishing (CMP) endpoint error to select an electrical testing sequence that stresses the M1 layer.

As shown in FIG. 3, die level data has more granularity than wafer level data and would be suitable for making die level decisions. One example of a die level decision would be to use die level inline data such as a defocus error due to a backside particle on the M4 layer detected by after develop inspection (ADI) to select an electrical testing sequence that stresses all layers from M4 to MTop.

In addition, as shown in FIG. 3, design subsection level data has more granularity than die level data and is suitable for making design subsection level decisions. One example of a design subsection level decision is to use design subsection level inline data such as a higher density of defects detected on a processor core block to select an electrical testing sequence that stresses that core regardless of the mask layers.

As further shown in FIG. 3, layout polygon level data has more granularity than design subsection level data and is suitable for making layout polygon level decisions. One example of a layout polygon level decision is to use layout polygon level data such as information about pinching defects detected on the M1 level in a specific marginal geometry to select an electrical testing sequence that prioritizes the test paths containing the specific marginal polygons and applies them as the first tests.

Therefore, as shown in FIG. 3, the granularity of the data can be matched to the granularity of the decisions that are to be made. In addition, the optimum granularity of the decisions that can be made using the embodiments described herein is at the individual layout polygon level, which is substantially greater than the previously achievable granularity for the decisions for electrical testing of wafers.

In some embodiments, the information for the one or more characteristics of the physical version of the wafer includes information for a portion of the physical layout components in the different layers that have one or more characteristics that are different from their as-designed one or more characteristics. For example, the one or more characteristics may include which of the components or structures on any given layer have different dimensions than those they were designed to have. Such information may include any of the information that may be generated by a tool such as a metrology tool and may be used in the same manner as described above with respect to the defect information. In this manner, when any tool indicates that the physical wafer may differ from its as-designed characteristics (whether that is due to a defect or due to a non-defect attribute of the wafer), that information may be used as described herein to tailor the electrical testing of the wafer to the actual characteristics of the physical wafer.

In one such embodiment, altering the at least one parameter includes selecting one or more of the electrical test paths that contain the portion of the physical layout components as a highest priority for the electrical testing and one or more of the electrical test paths that contain physical layout components neighboring the portion of the physical layout components as a next highest priority for the electrical testing. For example, in the case of inline data with location precision down to layout polygons, the method may include parsing the design itself to select test paths that contain such affected polygons as the top priority, and the test paths that contain polygons neighboring the affected polygons as the next priority, followed by the layer specific sequence of tests that reflect the layer of the affected polygon or polygons.

Selecting the order for the different electrical tests in an intelligent manner based on real time inline data acquired for a physical version of a wafer can provide significant benefits to wafer fabrication (e.g., by reducing the cost of testing, increasing the value of the electrical testing results, etc.). One example of the ways in which selecting the order for the electrical tests can be significantly beneficial will now be described.

In one example of how the method embodiments described herein can benefit wafer manufacturing and electrical testing, for a given IC XYZ, design analysis may be performed, and test paths may be annotated with the mask layers and design subsections that they stress preferentially. Let us assume that the total number of test vectors to be applied to this IC is 5000.

During wafer production, a wafer inspection system such as the 29xx NanoPoint capable wafer inspection system that is commercially available from KLA-Tencor, Milpitas, Calif., may pick up a strong signature of pinching defects on the M1 layer. However, scanning electron microscope (SEM) defect review may indicate that the pinching is not severe enough to cause clean open lines. As a result, the lot may be allowed to proceed through the line.

An ARTIST system configured as described herein may take note of the pinching defect event described above and look up the polygons that correspond to the 29xx defect locations. Next, the system may look up the test paths that contain these polygons. Finally, it may look up the test vectors that stimulate these test paths and arrange these vectors to be as early as possible in the test sequence for these wafers.

If the pinching is indeed going to cause these dies to fail, using the test plan generated as described above, the tester would identify that failure within the first few cycles of testing and save the test time associated with application of any remaining test vectors. In the best case, this would save 4999 test vectors from being applied, thus achieving a 99.98% time saving against the worst case where the failing polygon was stressed by the very last vector applied. Assuming a normal probability distribution, we can anticipate at least saving 50% time in identifying a failed die once it is on the tester. The lower the yield level, the higher the value of identifying the failing die sooner as the effect multiplies over more dies.

The embodiments described herein can also produce significant cost savings compared to other methods and systems for electrical testing. For example, the test costs per die are on the order of $0.50-$1.00 at wafer level testing. Considering a device that is at 70% yield with testing costs of $0.75, a 10,000 wafer/month volume of manufacturing for 500 dies/wafer leads to a population of 1.5 M dies that fail. If the ARTIST system embodiments described herein work as predicted and save on an average about half the time it takes to declare a die as failed, then an IC vendor may realize a savings of around $0.5 M per month. Considering a product ramp cycle of 4 months, this may lead to about $3 M test cost savings.

The embodiments described herein also promote more effective use of relatively expensive process control subsystems such as wafer inspection systems, wafer defect review systems, and metrology systems. For example, the latest tools like the 29xx and NanoPoint systems that are commercially available from KLA-Tencor provide substantially precise coordinates for the data that they produce. Therefore, translating that data generated at highly precise coordinates to the corresponding electrical test paths allows the electrical testing to be altered based on the process control data at virtually any granularity (e.g., the entire layer, a design subsection on an entire layer, and all the way down to individual physical layout components). As such, the substantially precise coordinates provided by the leading edge process control tools can be used to trigger substantially precise electrical test rearrangement.

In one embodiment, altering the at least one parameter of the electrical testing is not performed until the physical version of the wafer has been created and at least the inline process has been performed on the wafer. For example, unlike other methods that may be used to alter electrical testing processes, the embodiments described herein alter the electrical testing based on actual data about an actual wafer. Therefore, the electrical testing may vary from wafer to wafer and reflects the actual conditions that are present on the wafer and the actual problems that may be present on the wafer.

In some instances, the embodiments described herein include performing the electrical testing on the wafer. For example, the embodiments may include application of the selected test vector sequences to the devices under test in the order determined by the look up table. The embodiments may also include identification of failed dies on a given wafer per the usual on-tester procedures. The electrical test vector sequences and any other electrical testing described herein may be performed in any suitable manner using any suitable commercially available electrical testing devices and tools.

The steps of the computer-implemented method such as determining the electrical test paths, determining the one or more parameters of the electrical testing, acquiring the information for the one or more characteristics of the physical version of the wafer, and altering the at least one parameter of the electrical testing are performed by one or more computer systems, which may be configured as described further herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Figure 4:
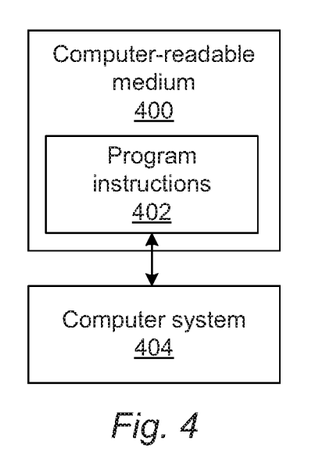
FIG. 4 is a block diagram illustrating one embodiment of a non-transitory computer-readable medium storing program instructions executable on a computer system for performing one or more of the computer-implemented method embodiments described herein.

Another embodiment relates to a non-transitory computer-readable medium storing program instructions executable on a computer system for performing a computer-implemented method for determining one or more parameters for electrical testing of a wafer. One such embodiment is shown in FIG. 4. For example, as shown in FIG. 4, non-transitory computer-readable medium 400 includes program instructions 402 executable on computer system 404 for performing the computer-implemented method for determining one or more parameters for electrical testing of a wafer described above. The computer-implemented method for which the program instructions are executable may include any other step(s) of any other method(s) described herein.

Program instructions 402 implementing methods such as those described herein may be stored on non-transitory computer-readable medium 400. The computer-readable medium may be a storage medium such as a magnetic or optical disk, a magnetic tape or any other suitable computer-readable medium known in the art.

The program instructions may be implemented in any of various ways, including procedure-based techniques, component-based techniques, and/or object-oriented techniques, among others. For example, the program instructions may be implemented using Matlab, Visual Basic, ActiveX controls, C, C++ objects, C#, JavaBeans, Microsoft Foundation Classes ("MFC"), or other technologies or methodologies, as desired.

Computer system 404 may take various forms, including a personal computer system, mainframe computer system, workstation, system computer, image computer, programmable image computer, parallel processor, or any other device known in the art. In general, the term "computer system" may be broadly defined to encompass any device having one or more processors, which executes instructions from a memory medium.

Figure 5:
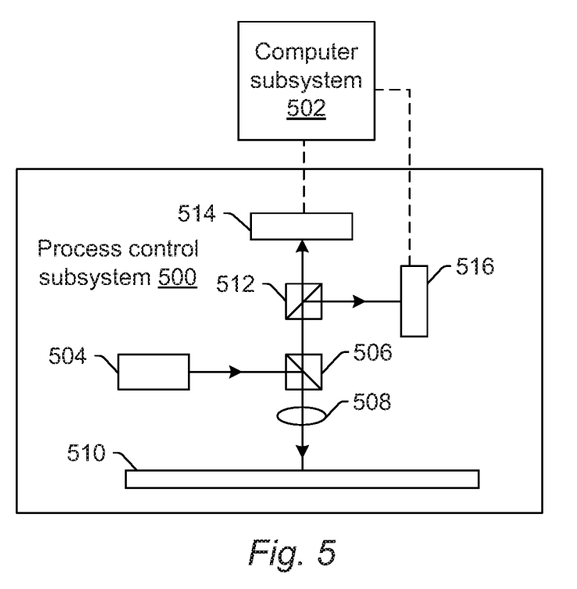
FIG. 5 is a schematic diagram illustrating a side view of one embodiment of a system configured to determine one or more parameters for electrical testing of a wafer.

An additional embodiment relates to a system configured to determine one or more parameters for electrical testing of a wafer. One embodiment of such a system is shown in FIG. 5. As shown in FIG. 5, the system includes process control subsystem 500 and computer subsystem 502. The process control subsystem is configured to acquire information for one or more characteristics of a physical version of a wafer. The information is generated by performing an inline process on the physical version of the wafer. The process control subsystem embodiment shown in FIG. 5 will be described further herein as a wafer inspection subsystem. However, the process control subsystem may be configured as any of the other process control subsystems described herein (e.g., a wafer defect review subsystem, a metrology subsystem, etc.).

As shown in FIG. 5, the process control subsystem includes light source 504, which may include any suitable light source known in the art. Light from the light source is directed to beam splitter 506, which is configured to direct the light from the light source though lens 508 to wafer 510. The light source may be coupled to any other suitable elements (not shown) such as one or more condensing lenses, collimating lenses, relay lenses, objective lenses, apertures, spectral filters, polarizing components and the like. As shown in FIG. 5, the light may be directed to the wafer at a normal angle of incidence. However, the light may be directed to the wafer at any suitable angle of incidence including near normal and oblique incidence. In addition, the light or multiple light beams may be directed to the wafer at more than one angle of incidence sequentially or simultaneously. The process control subsystem may be configured to scan the light over the wafer in any suitable manner.

Light reflected from wafer 510 may be collected and detected by multiple channels of the process control subsystem during scanning. For example, light specularly reflected from wafer 510 may be collected by lens 508. Lens 508 may include a refractive optical element as shown in FIG. 5. In addition, lens 508 may include one or more refractive optical elements and/or one or more reflective optical elements. Light collected by lens 508 may be directed through beam splitter 506 to beam splitter 512, which may be configured to separate the light into two different paths, one of which is directed to detector 514 and another of which is directed to detector 516. The beam splitters shown in FIG. 5 may include any suitable beam splitters known in the art. The detectors shown in FIG. 5 may include any suitable detectors known in the art such as charge coupled devices (CCDs) or another type of imaging detectors. Detectors 514 and 516 are configured to generate output that is responsive to the specularly reflected light. Therefore, each of the detectors form one channel of the process control subsystem.

Since the process control subsystem shown in FIG. 5 is configured to detect light specularly reflected from the wafer, the process control subsystem is configured as a bright field (BF) optical subsystem. Such a process control subsystem may, however, also be configured for other types of wafer inspection. For example, the process control subsystem shown in FIG. 5 may also include one or more other channels (not shown). The other channel(s) may include any of the optical components described herein such as a lens and a detector, configured as a scattered light channel. The lens and the detector may be further configured as described herein. In this manner, the process control subsystem may also be configured for dark field (DF) inspection. In addition, the process control subsystem shown in FIG. 5 may be replaced with an e-beam inspection subsystem.

Computer subsystem 502 is configured to acquire the output generated by the process control subsystem. For example, output generated by the detector(s) during scanning may be provided to computer subsystem 502. In particular, the computer subsystem may be coupled to each of the detectors (e.g., by one or more transmission media shown by the dashed lines in FIG. 5, which may include any suitable transmission media known in the art) such that the computer subsystem may receive the output generated by the detector(s). Computer subsystem 502 is configured to determine the information for the one or more characteristics of the physical version of the wafer using the output. For example, the computer subsystem may be configured to detect defects on the wafer using the output, which may be performed in any suitable manner known in the art.

The process control subsystem shown in FIG. 5 may also be configured as a metrology tool by careful selection of the elements shown in FIG. 5 and/or by changing one or more parameters of the elements of the process control subsystem. For example, since the process control subsystem is shown in FIG. 5 as detecting specularly reflected light, the process control subsystem may be configured as a reflectometer. However, by changing one or more parameters of the process control subsystem shown in FIG. 5 such as angle of incidence, polarization of illumination, wavelengths of illumination, angle of collection, polarization of collection, wavelengths of detection, etc., the process control subsystem may be configured as another type of metrology system such as a scatterometer, an ellipsometer, a diffractometer, or another type of light-based metrology system. The light-based metrology system may also be replaced with an electron beam-based metrology system such as a SEM. Furthermore, the process control subsystem may be replaced with any other suitable process control subsystem known in the art.

The process control subsystem may be configured to perform an inline process on the wafer in a number of different ways. For example, in one instance, the process control subsystem may be a tool that is located in a wafer fabrication facility and that is physically isolated from other tools in the facility and when an inline process is to be performed on a physical wafer, the physical wafer may be transferred from its current location in the fabrication facility to the tool. In another instance, the process control subsystem may be coupled to a fabrication tool (not shown) by a wafer handler (not shown) that can move wafers between the process control subsystem and the fabrication tool. In an additional instance, the process control subsystem may be incorporated into the physical housing of the fabrication tool such that it is a subsystem within the fabrication tool. The process control subsystem may also or alternatively be located within or coupled to a process chamber of a fabrication tool such that the subsystem can perform an inline process on the wafer as the process tool is performing a fabrication process on the wafer. In any case, the process control subsystem may be configured in a number of different ways such that it can perform the inline process in situ during a process step, in situ between two steps of one process, in situ after a process of the overall fabrication process, or in any other suitable manner.

The computer subsystem is configured for performing the steps of the computer-implemented method described further herein. For example, the computer subsystem is configured for determining the electrical test paths, determining the one or more parameters of the electrical testing, and altering the at least one parameter as described further herein. The computer subsystem may be configured to perform any other step(s) of any method embodiment(s) described herein. Since the computer subsystem shown in FIG. 5 is coupled directly to the detectors of the process control subsystem, this computer subsystem is configured as a computer subsystem that may be included in any wafer inspection, defect review, metrology, etc. tool. In the embodiment shown in FIG. 5, therefore, the same computer subsystem that determined the information for the characteristic(s) of the wafer may perform other steps described herein. In this manner, a process control tool such as a wafer inspection tool, a wafer metrology tool, a wafer defect review tool, etc. may be configured to determine and alter one or more parameters of electrical testing of a wafer.

However, one or more steps of the computer-implemented method may be performed by a different computer subsystem or additional computer subsystem(s). For instance, in one embodiment, determining the electrical test paths as described herein may be performed by a computer subsystem having a configuration tailored for handling and processing design data for devices being fabricated on wafers. In one such instance, such a computer subsystem may be part of an electronic design automation (EDA) system that has been configured to determine the electrical test paths as described herein.

In addition, in another embodiment, determining the one or more parameters of the electrical testing may be performed as described herein by an appropriately configured computer subsystem of an EDA tool or a computer subsystem used by a testing engineer or coupled to an electrical testing system. The computer subsystem included in the process control system or a computer subsystem used by the testing engineer or coupled to an electrical testing system may also be configured to alter the at least one parameter of the electrical testing as described herein. In this manner, the system described herein may include a number of different computer subsystems that are coupled in some manner (e.g., via transmission media that may be "wired" or "wireless") such that information can be shared among them. The computer subsystem(s), the process control subsystem, and the system may be further configured as described herein.

It is noted that FIG. 5 is provided herein to generally illustrate one configuration of a process control subsystem that may be included in the system embodiments described herein. Obviously, the process control subsystem configuration described herein may be altered to optimize the performance of the process control subsystem as is normally performed when designing a commercial process control system. In addition, the systems described herein may be implemented using an existing process control system (e.g., by adding functionality described herein to an existing process control system) such as the 29xx/28xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Further modifications and alternative embodiments of various aspects of the invention will be apparent to those skilled in the art in view of this description. For example, methods and systems for determining one or more parameters for electrical testing of a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A computer-implemented method for determining one or more parameters for electrical testing of a wafer, comprising:

determining a plurality of electrical test paths through a device being formed on a wafer and physical layout components in different layers of the device corresponding to each of the plurality of electrical test paths;
determining one or more parameters of electrical testing for the wafer based on one or more characteristics of the plurality of electrical test paths;
acquiring information for one or more characteristics of a physical version of the wafer, wherein the information is generated by a process control system performing an inline process on the physical version of the wafer;
altering at least one of the one or more parameters based on the acquired information, wherein determining the plurality of electrical test paths, determining the one or more parameters, acquiring the information, and altering the at least one parameter are performed by a computer system, and wherein the computer system is a device having one or more processors; and
performing the electrical testing on the wafer with electrical testing equipment and the altered at least one of the one or more parameters.

2. The method of claim 1, wherein the one or more characteristics of the plurality of electrical test paths comprise a pareto of the plurality of electrical test paths as a function of fractions of layout lengths for the plurality of electrical test paths on one of the different layers.

3. The method of claim 1, wherein the one or more characteristics of the plurality of electrical test paths comprise different paretos for each of the different layers of interest, and wherein each of the different paretos are of the plurality of electrical test paths as a function of fractions of layout lengths for the plurality of electrical test paths on its corresponding one of the different layers.

4. The method of claim 1, wherein the one or more parameters comprise test vector sequences that stress one of the different layers in a preferential manner.

5. The method of claim 1, wherein the one or more parameters comprise different test vector sequences for each of the different layers that are of interest to a user, and wherein the different test vector sequences are for stressing each of the different layers in a preferential manner.

6. The method of claim 1, wherein the one or more parameters comprise different test vector sequences for each of the different layers that are of interest to a user, and wherein the different test vector sequences are for stressing each of the different layers in a preferential manner and based on design sub-sections within the different layers.

7. The method of claim 1, further comprising storing the one or more parameters in a storage medium, wherein the one or more parameters comprise test vector sequences in different test plans for the wafer, and wherein each of the different test plans is stored with identification for the different layers or different design sub-sections within the different layers that the different test plans stress preferentially.

8. The method of claim 1, wherein the process control system comprises a wafer inspection system or a wafer defect review system, and wherein the information for the one or more characteristics of the physical version of the wafer comprises information for defects detected on the physical version of the wafer by the wafer inspection system or the wafer defect review system.

9. The method of claim 1, wherein the process control system comprises a wafer metrology system, and wherein the information for the one or more characteristics of the physical version of the wafer comprises measurements of the one or more characteristics performed on the physical version of the wafer by the wafer metrology system.

10. The method of claim 1, wherein process steps of fabrication of the device on the wafer are performed, and wherein the inline process is performed during one of the process steps or between the process steps of the fabrication of the device on the wafer.

11. The method of claim 1, wherein the information for the one or more characteristics of the physical version of the wafer comprises information for which of the different layers on which the inline process was performed.

12. The method of claim 1, wherein the information for the one or more characteristics of the physical version of the wafer comprises information for locations within any one of the different layers at which the one or more characteristics of the physical version of the wafer were determined by the inline process.

13. The method of claim 1, wherein the information is further generated by performing at least one additional inline process on the wafer.

14. The method of claim 1, wherein altering the at least one parameter comprises selecting an order in which different tests are performed during the electrical testing.

15. The method of claim 1, wherein altering the at least one parameter comprises selecting a test vector sequence for the electrical testing that stresses one of the different layers or a portion of one of the different layers in which the information for the one or more characteristics of the physical version of the wafer indicate one or more defects have been detected.

16. The method of claim 1, wherein the information for the one or more characteristics of the physical version of the wafer comprises information for a portion of the physical layout components in the different layers that have one or more characteristics that are different from their as-designed one or more characteristics, and wherein altering the at least one parameter comprises selecting one or more of the plurality of electrical test paths that contain the portion of the physical layout components as a highest priority for the electrical testing and one or more of the plurality of electrical test paths that contain physical layout components neighboring the portion of the physical layout components as a next highest priority for the electrical testing.

17. The method of claim 1, wherein altering the at least one parameter is not performed until the physical version of the wafer has been created and at least the inline process has been performed on the wafer.

18. The method of claim 1, wherein determining the plurality of electrical test paths through the device being formed on the wafer and the physical layout components in the different layers of the device corresponding to each of the plurality of electrical test paths is performed by processing design data for the device being formed on the wafer.

19. A non-transitory computer-readable medium, storing program instructions executing on a computer system for performing a computer-implemented method for determining one or more parameters for electrical testing of a wafer, wherein the computer-implemented method comprises:
determining a plurality of electrical test paths through a device being formed on a wafer and physical layout components in different layers of the device corresponding to each of the plurality of electrical test paths based on design data for the device;
determining one or more parameters of electrical testing for the wafer based on one or more characteristics of the plurality of electrical test paths;
acquiring information for one or more characteristics of a physical version of the wafer, wherein the information is generated by a process control system performing an inline process on the physical version of the wafer and wherein the information is acquired by the computer system from a storage medium in which the information has been stored by the process control system; and altering at least one of the one or more parameters based on the acquired information, wherein the computer system is a device having one or more processors.

20. A system configured to determine one or more parameters for electrical testing of a wafer, comprising:

a process control subsystem configured to acquire information for one or more characteristics of a physical version of a wafer, wherein the information is generated by performing an inline process on the physical version of the wafer; and a computer system configured for:
  determining a plurality of electrical test paths through a device being formed on the wafer and physical layout components in different layers of the device corresponding to each of the plurality of electrical test paths based on design data for the device;
  determining one or more parameters of electrical testing for the wafer based on one or more characteristics of the plurality of electrical test paths; and
  altering at least one of the one or more parameters based on the acquired information, wherein the computer system is a device having one or more processors, and wherein electrical testing equipment is configured to perform the electrical testing on the wafer with the altered at least one of the one or more parameters.

21. The system of claim 20, wherein the one or more characteristics of the plurality of electrical test paths comprise a pareto of the plurality of electrical test paths as a function of fractions of layout lengths for the plurality of electrical test paths on one of the different layers.

22. The system of claim 20, wherein the one or more characteristics of the plurality of electrical test paths comprise different paretos for each of the different layers of interest, and wherein each of the different paretos are of the plurality of electrical test paths as a function of fractions of layout lengths for the plurality of electrical test paths on its corresponding one of the different layers.

23. The system of claim 20, wherein the one or more parameters comprise test vector sequences that stress one of the different layers in a preferential manner.

24. The system of claim 20, wherein the one or more parameters comprise different test vector sequences for each of the different layers that are of interest to a user, and wherein the different test vector sequences are for stressing each of the different layers in a preferential manner.

25. The system of claim 20, wherein the one or more parameters comprise different test vector sequences for each of the different layers that are of interest to a user, and wherein the different test vector sequences are for stressing each of the different layers in a preferential manner and based on design sub-sections within the different layers.

26. The system of claim 20, wherein the computer system is further configured for storing the one or more parameters in a storage medium, wherein the one or more parameters comprise test vector sequences in different test plans for the wafer, and wherein each of the different test plans is stored with identification for the different layers or different design sub-sections within the different layers that the different test plans stress preferentially.

27. The system of claim 20, wherein the process control subsystem comprises a wafer inspection system or a wafer defect review system, and wherein the information for the one or more characteristics of the physical version of the wafer comprises information for defects detected on the physical version of the wafer by the wafer inspection system or the wafer defect review system.

28. The system of claim 20, wherein the process control subsystem comprises a wafer metrology system, and wherein the information for the one or more characteristics of the physical version of the wafer comprises measurements of the one or more characteristics performed on the physical version of the wafer by the wafer metrology system.

29. The system of claim 20, wherein process steps of fabrication of the device on the wafer are performed, and wherein the inline process is performed during one of the process steps or between the process steps of the fabrication of the device on the wafer.

30. The system of claim 20, wherein the information for the one or more characteristics of the physical version of the wafer comprises information for which of the different layers on which the inline process was performed.

31. The system of claim 20, wherein the information for the one or more characteristics of the physical version of the wafer comprises information for locations within any one of the different layers at which the one or more characteristics of the physical version of the wafer were determined by the inline process.

32. The system of claim 20, wherein the information is further generated by performing at least one additional inline process on the wafer.

33. The system of claim 20, wherein altering the at least one parameter comprises selecting an order in which different tests are performed during the electrical testing.

34. The system of claim 20, wherein altering the at least one parameter comprises selecting a test vector sequence for the electrical testing that stresses one of the different layers or a portion of one of the different layers in which the information for the one or more characteristics of the physical version of the wafer indicate one or more defects have been detected.

35. The system of claim 20, wherein the information for the one or more characteristics of the physical version of the wafer comprises information for a portion of the physical layout components in the different layers that have one or more characteristics that are different from their as-designed one or more characteristics, and wherein altering the at least one parameter comprises selecting one or more of the plurality of electrical test paths that contain the portion of the physical layout components as a highest priority for the electrical testing and one or more of the plurality of electrical test paths that contain physical layout components neighboring the portion of the physical layout components as a next highest priority for the electrical testing.

36. The system of claim 20, wherein altering the at least one parameter is not performed until the physical version of the wafer has been created and at least the inline process has been performed on the wafer.

\* \* \* \* \*